United States Patent
Park

(10) Patent No.: US 7,564,272 B2
(45) Date of Patent: Jul. 21, 2009

(54) DIFFERENTIAL AMPLIFIER

(75) Inventor: In-soo Park, Suwon-si (KR)

(73) Assignee: Oki Semiconductor Co., Ltd., Tokyo (JP)

(*) Notice: Subject to any disclaimer, the term of this patent is extended or adjusted under 35 U.S.C. 154(b) by 0 days.

(21) Appl. No.: 11/526,693

(22) Filed: Sep. 26, 2006

(65) Prior Publication Data

US 2007/0085605 A1  Apr. 19, 2007

(30) Foreign Application Priority Data

Sep. 26, 2005  (KR) .................. 10-2005-0089541

(51) Int. Cl.
*H03F 3/45* (2006.01)
(52) U.S. Cl. .................. 327/89; 327/563; 330/253
(58) Field of Classification Search ............... None
See application file for complete search history.

(56) References Cited

U.S. PATENT DOCUMENTS

| | | | | |
|---|---|---|---|---|
| 5,349,304 A * | 9/1994 | Ryat | ........................ | 330/253 |
| 5,420,539 A * | 5/1995 | Fensch | ........................ | 330/253 |
| 6,281,731 B1 * | 8/2001 | Fifield et al. | ................. | 327/205 |
| 6,614,272 B1 * | 9/2003 | Hayashi | ........................ | 327/77 |
| 6,657,486 B2 * | 12/2003 | Kimura | ........................ | 327/563 |
| 6,919,767 B2 * | 7/2005 | Mechnig et al. | ............. | 330/253 |

FOREIGN PATENT DOCUMENTS

| | | |
|---|---|---|
| JP | 11-027138 | 1/1999 |
| JP | 2003-273672 | 9/2003 |
| KR | 1990-0009177 | 12/1990 |
| KR | 1019970001311 B1 | 2/1997 |
| KR | 10-1999-0008514 | 2/1999 |
| KR | 100257545 B1 | 3/2000 |
| KR | 100271796 | 8/2000 |
| KR | 1020010007126 A | 1/2001 |
| KR | 1020010086324 A | 9/2001 |

* cited by examiner

*Primary Examiner*—Lincoln Donovan
*Assistant Examiner*—Terry L Englund
(74) *Attorney, Agent, or Firm*—Volentine & Whitt, P.L.L.C.

(57) ABSTRACT

A differential amplifier is disclosed. The differential amplifier includes a first load element coupled between a first voltage and a first node. A second load element is coupled between the first voltage and a second node. A current source is coupled between a second voltage and a third node. A first input element is coupled between the first node and the third node and receives an input signal so as to adjust a voltage level of the first node. A second input element is coupled between the second node and the third node and receives a reference voltage signal so as to adjust a voltage level of the second node. A third input element is coupled between the second node and the third node and receives the input signal so as to adjust the voltage level of the second node.

20 Claims, 6 Drawing Sheets

DIFFERENTIAL AMPLIFIER

CROSS-REFERENCE TO RELATED APPLICATION

This application claims priority from Korean Patent Application No. 10-2005-0089541 filed on Sep. 26, 2005 in the Korean Intellectual Property Office, the disclosure of which is incorporated herein by reference in its entirety.

BACKGROUND OF THE INVENTION

1. Field of the Invention

The present disclosure relates to a differential amplifier. More particularly, the present disclosure relates to a differential amplifier having improved operating characteristics.

2. Description of the Related Art

Differential amplifiers are widely used in integrated circuit (IC) devices. Differential amplifiers are designed to amplify the difference between two input signals while rejecting any common signal components. Therefore, when two signal lines are used as inputs to the differential amplifier, electrical noise commonly induced to the two signal lines will have no effect on the output signal thus allowing only the difference in signals of the signal lines to be amplified.

A conventional differential amplifier generally includes a load element, an input element and a current source. For example, a single-ended differential amplifier can be coupled to a first voltage node that is electrically coupled to an internal power supply voltage through a load element and to a second voltage node that is electrically coupled to a ground voltage through a current source, and two input elements of the single ended differential amplifier can be coupled in parallel with each other between the load element and the current source to receive an input signal and a reference voltage signal respectively.

It should be noted that as the power supply voltage used for an IC device drops, internal devices within a differential amplifier incorporated into the IC tend to inadvertently change. For example, as the internal power voltage level drops, an internal reference voltage level upon which the differential amplifier relies also drops. When this reference voltage level is low and a low level input signal is input to the differential amplifier, the response speed at which certain NMOS transistors incorporated into the differential amplifier slows and as a result the delay of the output signal increases. In other words, the level of a differential amplifier's reference voltage signal can cause an undue delay in the differential amplifier's output signal. Therefore, new technology related to differential amplifiers that are insensitive to reference voltage levels is desirable.

SUMMARY OF THE INVENTION

An object of the invention is to provide a differential amplifier in which the operating characteristic is improved. The above stated objects as well as other objects, features and advantages, of the invention will become clear to those skilled in the art upon review of the following description.

According to an aspect of the invention in order to achieve the object, there is provided a differential amplifier including a first load element coupled between a first voltage node and a first node, wherein the first voltage node is electrically coupled to a first voltage, a second load element coupled between the first voltage node and a second node, a current source coupled between a second voltage node and a third node, wherein the second voltage node is electrically coupled to a second voltage, a first input element that is coupled between the first node and the third node and receives an input signal so as to adjust a voltage level of the first node, a second input element that is coupled between the second node and the third node and receives a reference voltage signal so as to adjust a voltage level of the second node, and a third input element that is coupled between the second node and the third node and receives the input signal so as to adjust the voltage level of the second node.

According to another aspect of the invention in order to achieve the object, there is provided a differential amplifier including a first load element coupled between a first voltage node and a first node, wherein the first voltage node is electrically coupled to a first voltage, a second load element coupled between the first voltage node and a second node, a current source coupled between a second voltage node and a third node, wherein the second voltage node is electrically coupled to a second voltage, a first NMOS transistor that is coupled between the first node and the third node and is turned on in response to an input signal so as to adjust a voltage level of the first node, a second NMOS transistor that is coupled between the second node and the third node and is turned on in response to a reference voltage signal so as to adjust a voltage level of the second node, and a third NMOS transistor that is coupled between the second node and the third node and is turned on in response to the inverted signal of the input signal so as to adjust the voltage level of the second node.

The details of other examples are included in the detailed description below and the appending drawings.

BRIEF DESCRIPTION OF THE DRAWINGS

The above and other features and advantages of the invention will become more apparent by describing in detail preferred embodiments thereof with reference to the attached drawings in which.

DETAILED DESCRIPTION OF THE INVENTION

Figure 1:
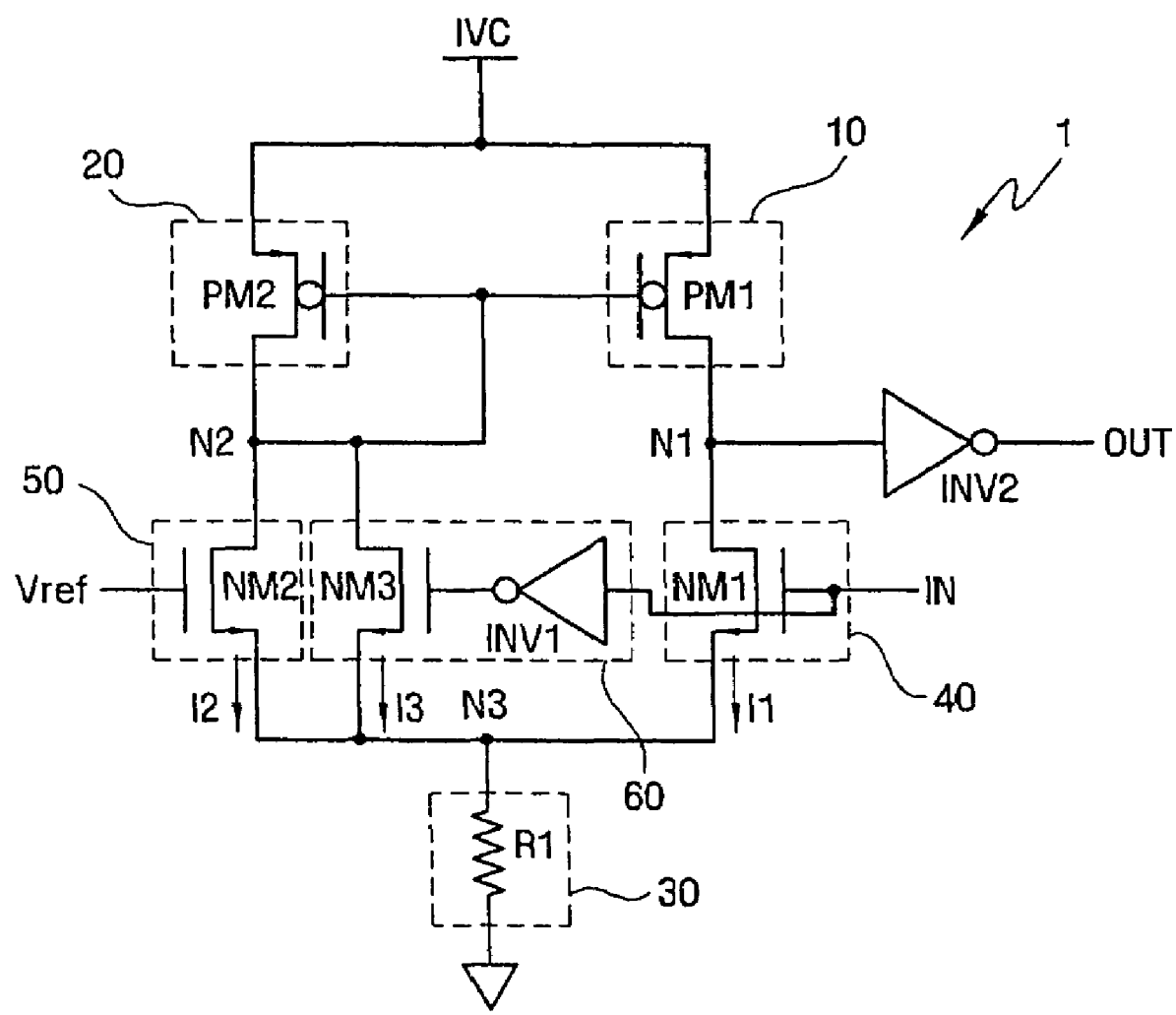
FIG. 1 is a circuit diagram illustrating a differential amplifier according to an illustrative embodiment.

Advantages and features of the invention and methods of accomplishing the same may be understood more readily by referring to the following detailed description of preferred embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the invention will only be defined by the appended claims. Like reference numerals refer to like elements throughout the specification. Hereinafter, embodiments according to the invention will be described in more detail with reference to the accompanying drawings in order to specifically explain the invention.

FIG. 1 is a circuit diagram illustrating a differential amplifier according to an illustrative embodiment. In this embodiment, a single-ended differential amplifier 1 will be explained as an example, but the invention is not limited thereto. As shown in FIG. 1, the differential amplifier 1 includes first and second load elements 10 and 20, a current source 30, a first input element 40, a second input element 50 and a third input element 60.

The first load element 10 is coupled between a first voltage node and a first node N1, wherein the first voltage node is electrically coupled to an internal power supply voltage IVC, and the second load element 20 is coupled between the first voltage node and a second node N2.

In this embodiment, the first and second load elements 10 and 20, respectively consisting of first and second PMOS transistors PM1 and PM2 with their gate coupled to a common node N2, may be used as a current mirror. Note that when the first and second PMOS transistors PM1 and PM2 are configured so as to build a current mirror as shown in FIG. 1, the second PMOS transistor PM2 is coupled to act as a diode such that the resistance value is too small to obtain a large output amplitude and it is possible to obtain an output voltage from node N1 on the side of PMOS transistor PM1.

Further, while it is possible that the first and second PMOS transistors PM1 and PM2 can have substantially the same size, their relative sizes to one another can vary substantially from embodiment to embodiment. Accordingly, for the following disclosure the term "size of MOS transistor" means a ratio of the width W to the length L of the channel region, that is, a W/L ratio. However, since the length of a transistor's channel region is typically set to a practical minimum, changing the W/L ratio is typically an issue of widening the channel width of the transistor. Also note that the term "having substantially the same size" means, for example, that the W/L ratios are equal to each other or are different from each other only by the error margins that occur during the manufacturing processes.

Additionally, the term "duty" as used herein refers to a time ratio of a high level output signal versus a low level output signal.

Also, the term "skew" refers to the difference between the maximum delay and the minimum delay of an output signal.

Returning to FIG. 1, the current source 30 is coupled between a third node N3 and a second voltage node which is in turn electrically coupled to a ground voltage. The current source 30 functions as a constant current source, and in various embodiments can use a resistor R1.

The first input element 40 is coupled between the first node N1 and the third node N3 and receives an input signal IN that adjusts the voltage level of the node N1. In various embodiments the first input element 40 may be a first NMOS transistor NM1 having a gate receiving the input signal IN. Here, the input signal IN may be a TTL logic level signal.

The second input element 50 is coupled between the second node N2 and the third node N3 and receives a reference voltage signal Vref to adjust the voltage level of the node N2. The second input element 50 may also be a NMOS transistor NM2 having a gate receiving the reference voltage signal Vref. Here, the reference voltage signal Vref is preferably a constant voltage in which the voltage level does not vary. In certain embodiments the reference voltage signal Vref may be provided from the outside of an integrated circuit device through a specific input pin while in other embodiments the reference voltage signal Vref may be generated internally. Also note that the voltage level of the reference voltage signal Vref may be a half of the internal power supply voltage.

The third input element 60 is coupled between the second node N2 and the third node N3, and can receive the input signal IN to adjust the voltage level of the second node N2. In this embodiment, the third input element 60 may include an inverter INV1 inverting the input signal IN, and a third NMOS transistor NM3 that is coupled between the second node N2 and the third node N3 with its gate receiving a signal produced by the inversion of the inverter INV1.

Here, the first and second NMOS transistors NM1 and NM2 may be substantially the same size, while the size of the third NMOS transistor NM3 may be about 10% to 100% of that of the second NMOS transistor NM3. However, the exemplary amplifier 1 and its variants are not limited to these ratios.

An inverter INV2 is coupled to the first node N1 to invert the logic level of the first node N1 and provide the inverted result as an output signal OUT.

Hereinafter, the operation of the differential amplifier 1 according to the embodiment of the invention will be described with reference to FIG. 1. For convenience of explanation, it is assumed that the input signal IN swings between 0.5V and 1.3V and the reference voltage signal Vref is fixed at 0.9V.

In operation, when the voltage level of the input signal IN to the gate of the first NMOS transistor NM1 is higher than the voltage level of the reference voltage signal Vref input to the gate of the second NMOS transistor NM2 (that is, when the input signal IN is of a high level), the resistance of the first NMOS transistor is smaller than that of the second NMOS transistor NM2. Therefore, the current I1 flowing through the first NMOS transistor is higher than the current I2 flowing through the second NMOS transistor NM2. As a result, the voltage level of the first node N1 is lower than that at the second node N2, and thus the output signal OUT should be a high-level signal.

Here, the inverter INV1 inverts the TTL logic level input signal IN into a CMOS logic level signal to be provided to the gate of the third NMOS transistor NM3. This causes the third NMOS transistor NM3 to stay in the 'OFF' state.

Next, when the voltage level of the input signal IN provided to the gate of the first NMOS transistor NM1 is lower than that of the reference voltage signal Vref input to the gate of the second NMOS transistor (that is, when the input signal IN is of a low level), the resistance of the first NMOS transistor NM1 is larger than that of the second NMOS transistor NM2 and the current I1 flowing through the first NMOS transistor NM1 should be lower than the current I2 flowing through the second NMOS transistor NM2.

In addition, the inverter INV1 can invert the TTL logic level input signal IN to a CMOS logic level signal, which is then provided to the gate of the third NMOS transistor NM3. As a result, the third NMOS transistor NM3 is turned on so a current I3 can flow through. In other words, when a low level input signal IN is input, the third NMOS transistor NM3, as well as the second NMOS transistor, is turned on. Therefore, the voltage level of the second node N2 quickly becomes lower than that of the first node N1, and consequently the output signal OUT will be a low-level signal.

In conclusion, when the third NMOS transistor NM3 (coupled in parallel with the second NMOS transistor NM2) receives the input signal IN, it allows an additional current I3 to flow from node N2 to node N3 thereby improving the delay when a low level input signal IN is input. Note that when the reference voltage signal Vref is bumped, e.g., the reference voltage signal Vref drops from 0.9V down to 0.7V, the operating characteristic of the differential amplifier 1 can be remarkably improved. Since the low level input signal IN is 0.5V, the voltage difference between the reference voltage signal Vref and the input signal IN is very small. When the third NMOS transistor NM3 receives the signal obtained by inverting the low level input signal IN, it can quickly increase the voltage difference between the first node N1 and the second node N2 thereby improving the delay when a low level input signal IN is provided.

Due to the operation of the third NMOS transistor NM3 the output delay can be shortened for an output signal OUT corresponding to a low level input signal IN. Therefore, the output signal's duty can be constantly maintained and skew can be reduced.

Note that it is natural for some predetermined delay to occur to invert the input signal IN of the inverter INV1 of the third input element 60, but the delay is so short as to be negligible.

The size of the third NMOS transistor NM3 may be about 10% to 100% of the size of the second NMOS transistor NM2. The function of the third NMOS transistor NM3 is to adjust the voltage level of the second node N2, similar to the second NMOS transistor NM2 but just supports the operation of the second NMOS transistor NM2. This allows for the third NMOS transistor NM3 to be designed smaller than the second NMOS transistor NM2 with the caveat that the size of the third NMOS transistor NM3 can also vary as a function of the manufacturing process variations.

Figure 2:
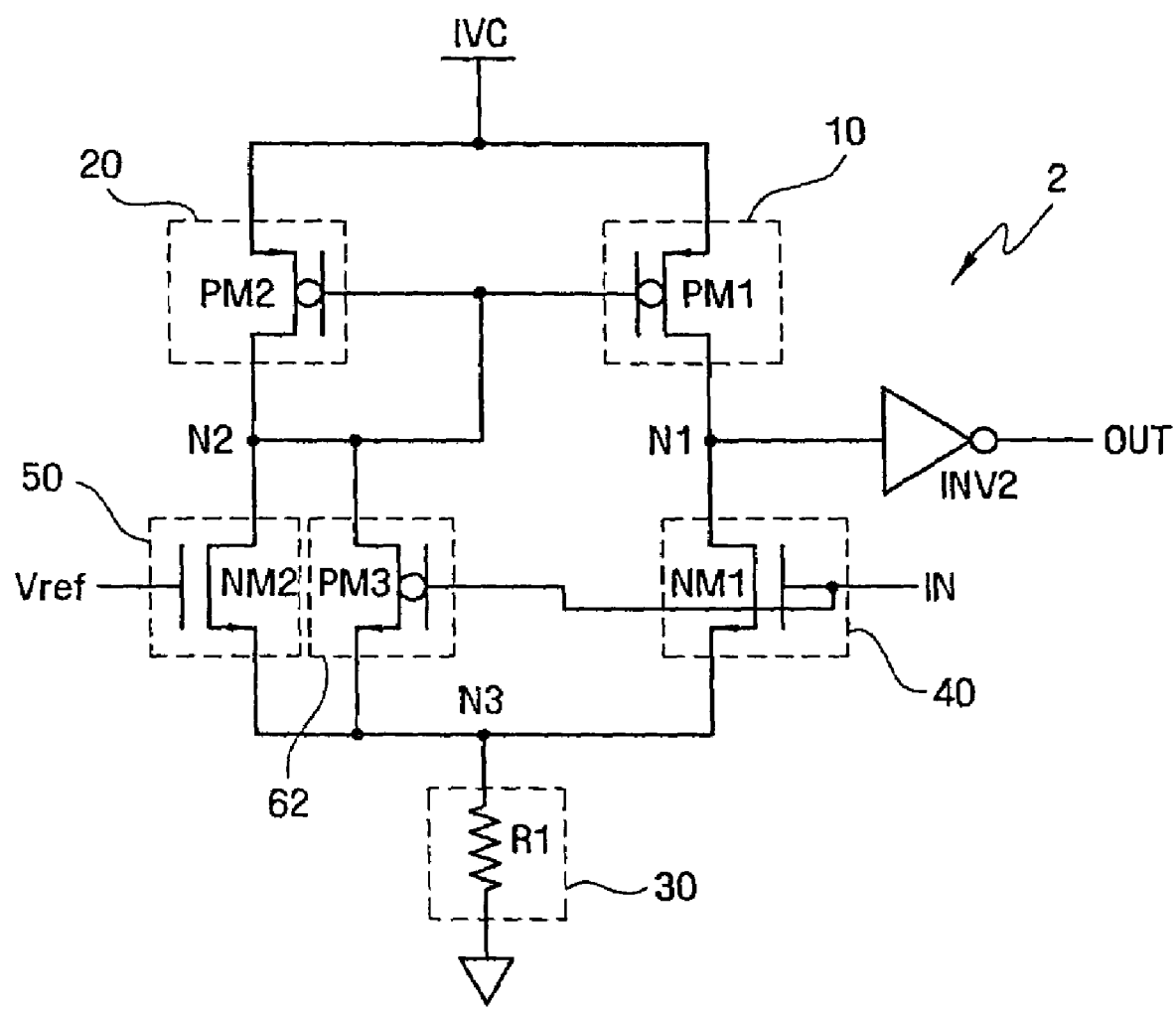
FIG. 2 is a circuit diagram illustrating a differential amplifier according to another illustrative embodiment.
Figure 3A:
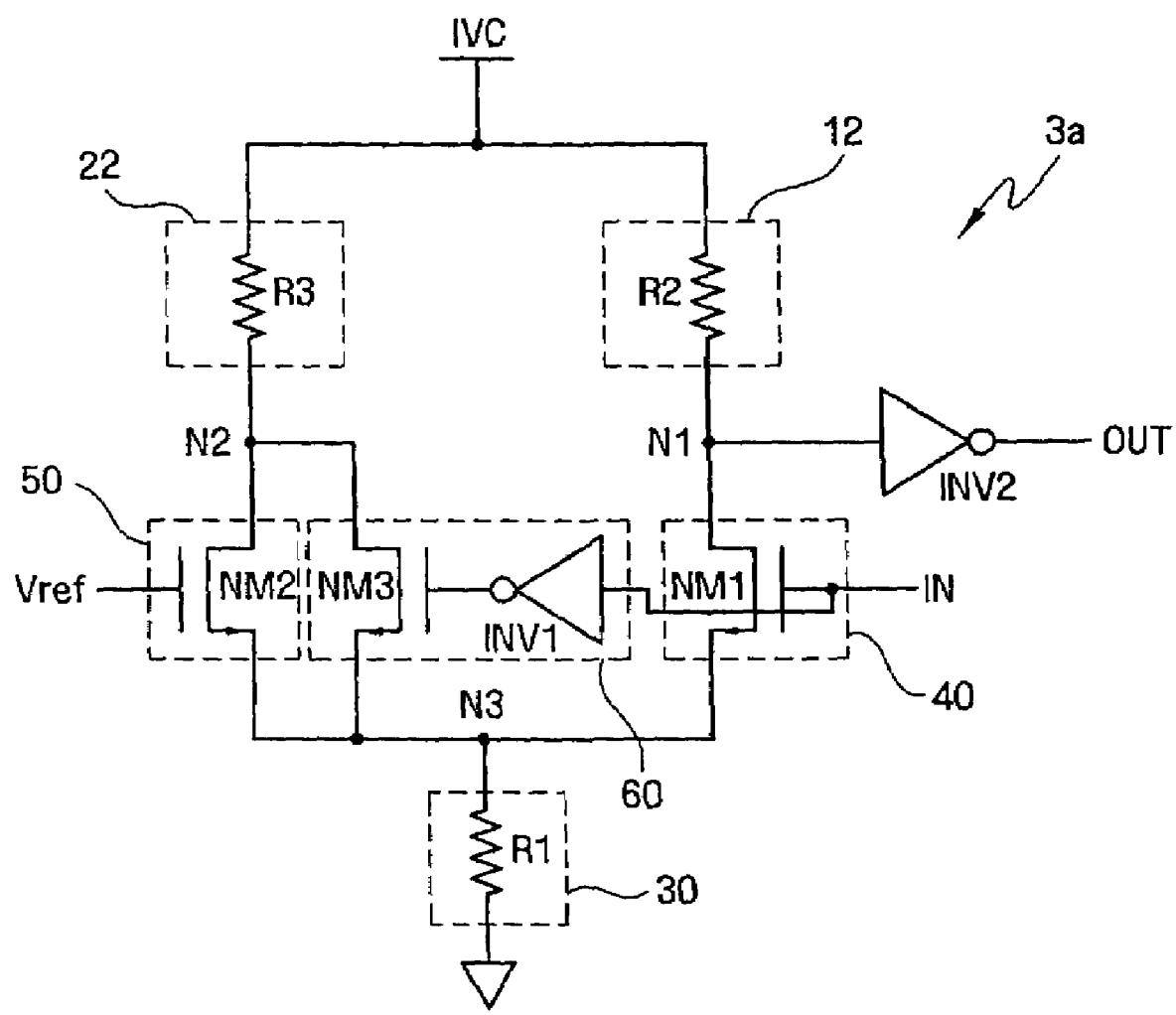
FIGS. 3A and 3B are circuit diagrams illustrating differential amplifiers according to further illustrative embodiments.
Figure 3B:
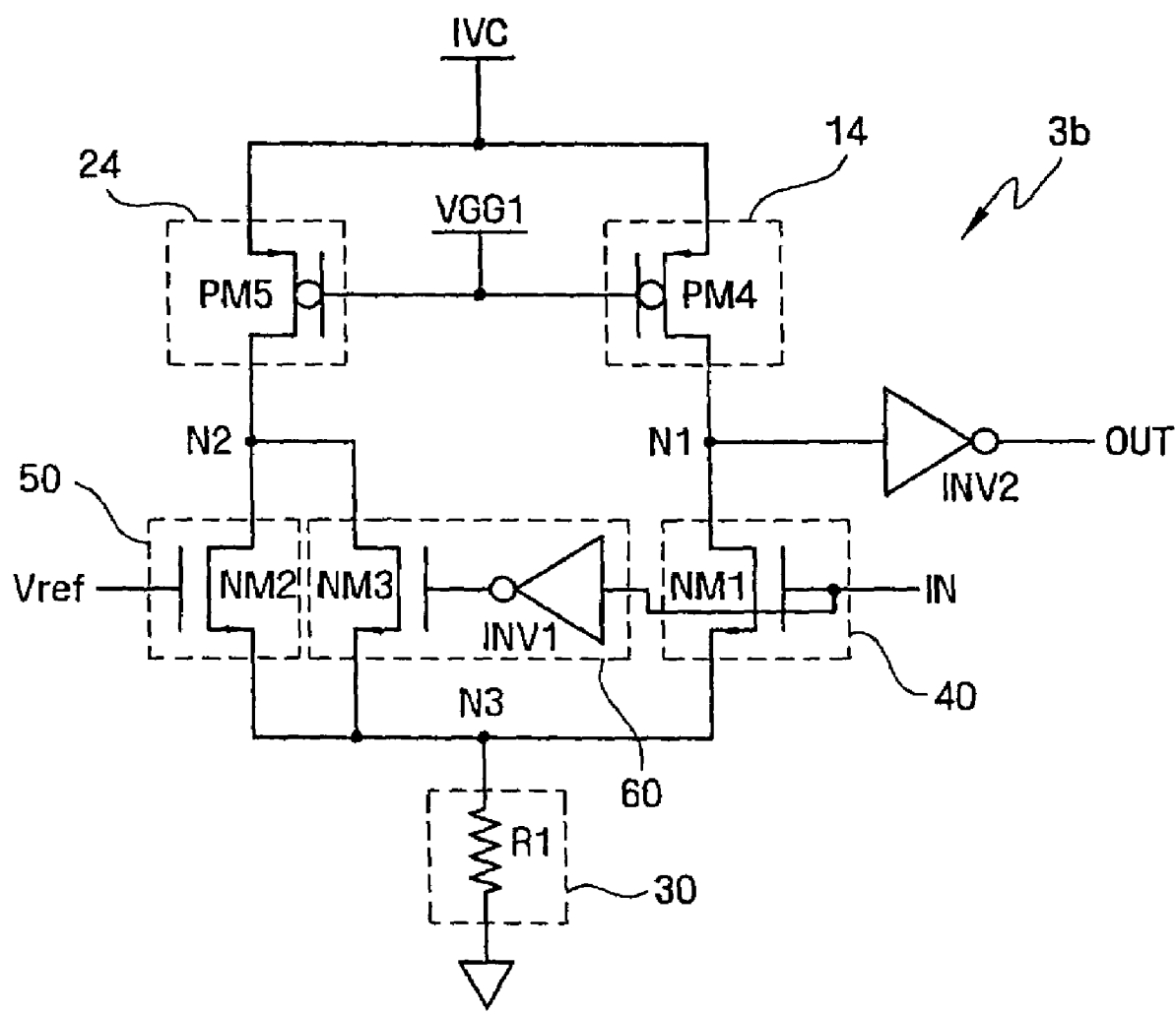
Figure 4:
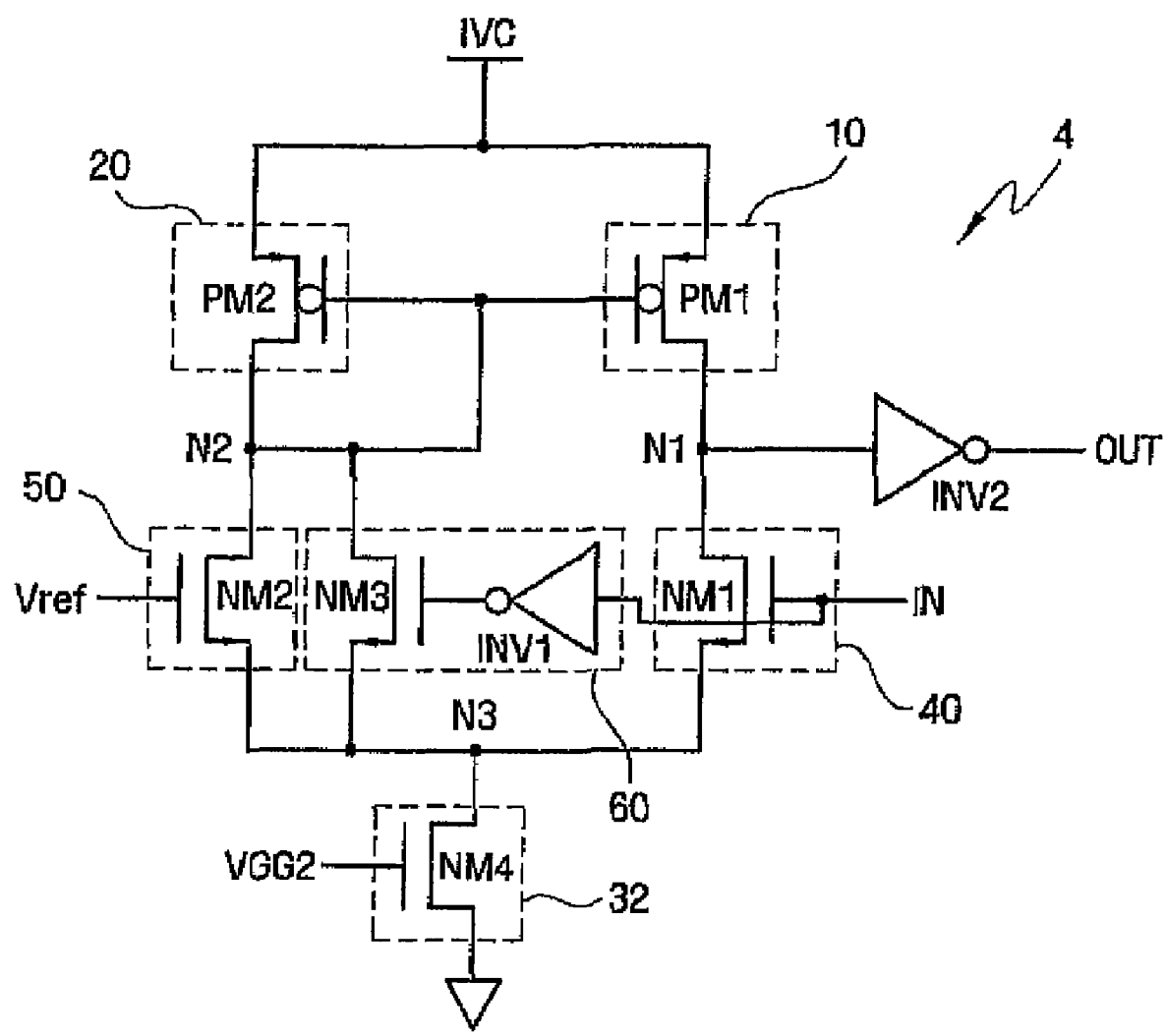
FIG. 4 is a circuit diagram illustrating a differential amplifier according to yet another illustrative embodiment.

FIGS. 2 through 4 illustrate several more exemplary differential amplifiers. For all of FIGS. 2 to 4, the same components as those in FIG. 1 are denoted by the same reference symbols, and descriptions thereof will be omitted.

Referring first to FIG. 2, the differential amplifier 2 according to this embodiment is different from the embodiment of FIG. 1 in that a third PMOS transistor PM3 is used as the third input element 62. As in the first embodiment, when the third NMOS transistor (NM3 in FIG. 1) is used as the third input element, the inverted signal of the input signal is input to the gate of the third NMOS transistor. However, when the third PMOS transistor PM3 is used as the third input element, the input signal is directly input to the gate of the third PMOS transistor.

Referring next to FIG. 3A, this differential amplifier 3A uses resistors R2 and R3 as first and second load elements 12 and 22, respectively. Next, referring to FIG. 3B, for this differential amplifier 3B the first load element 14 is a fourth PMOS transistor PM4 coupled between the first voltage node and the first node N1. Further, the second load element 24 is a fifth PMOS transistor PM5 coupled between the first voltage node and the second node N2. A common gate voltage VGG1 is applied to the gates of the fourth and fifth transistors PM4 and PM5.

Continuing to FIG. 4, this exemplary differential amplifier 4 may use a fourth NMOS transistor NM4 as a current source 32. The transistor NM4 is coupled between the second voltage node and the third node N3 and is supplied with a constant gate voltage VGG2.

It can be advantageous for the voltage drop in the fourth NMOS transistor NM4 to be as small as possible. Further, as the current source 32 for the differential amplifier 4 should operate as a constant current source, the fourth NMOS transistor NM4 should operate in a saturation region. In order to operate the fourth NMOS transistor NM4 in the saturation region, it is necessary to satisfy the conditional expression $V_{DS} \geq V_{GS} - V_{th}$.

Here, D, S, and G represent the drain, the source, and the gate, respectively. Since the $V_{DS}$ is set as low as possible as described above, the $V_{DS}$ can be selected to be slightly higher than a threshold voltage $V_{th}$. Note that the differential amplifier 4 according to this embodiment of the invention can require a separate voltage generating circuit for supplying the gate voltage $V_{GG2}$.

More details of the invention will be described with reference to the following specific experimental examples. However, it will be apparent that one skilled in the art can understand any content that will not be described herein.

EXPERIMENTAL EXAMPLES

The inventors of the disclosed devices performed a simulation using HSPICE by inputting an input signal and a reference voltage signal according to each of four scenarios with a device model that resembles the differential amplifier 1 shown in FIG. 1.

Scenario 1 is a case in which the input signal swings between 0.5 V and 1.3 V and the reference voltage signal is bumped to 0.9V±0.2V, scenario 2 is a case in which the input signal swings between 0V and 1.8V and the reference voltage signal is fixed to 0.9V, scenario 3 is a case in which the input signal swings between 0V and 1.8V and the reference voltage signal is bumped to 0.9V±0.2V, and scenario 4 is a case in which the input signal swings between 0.5V and 1.3V and the reference voltage signal is fixed at 0.9V. The simulation results according to the respective scenarios are shown in FIG. 5C at the same time.

The inventors of the disclosed devices also performed a similar HSPICE simulation by inputting the input signal and the reference voltage signal according to each of the above-mentioned four scenarios to a differential amplifier that excludes the third input element. The simulation results according to the respective scenarios are shown in FIG. 5B at the same time.

COMPARATIVE EXAMPLES

Figure 5:
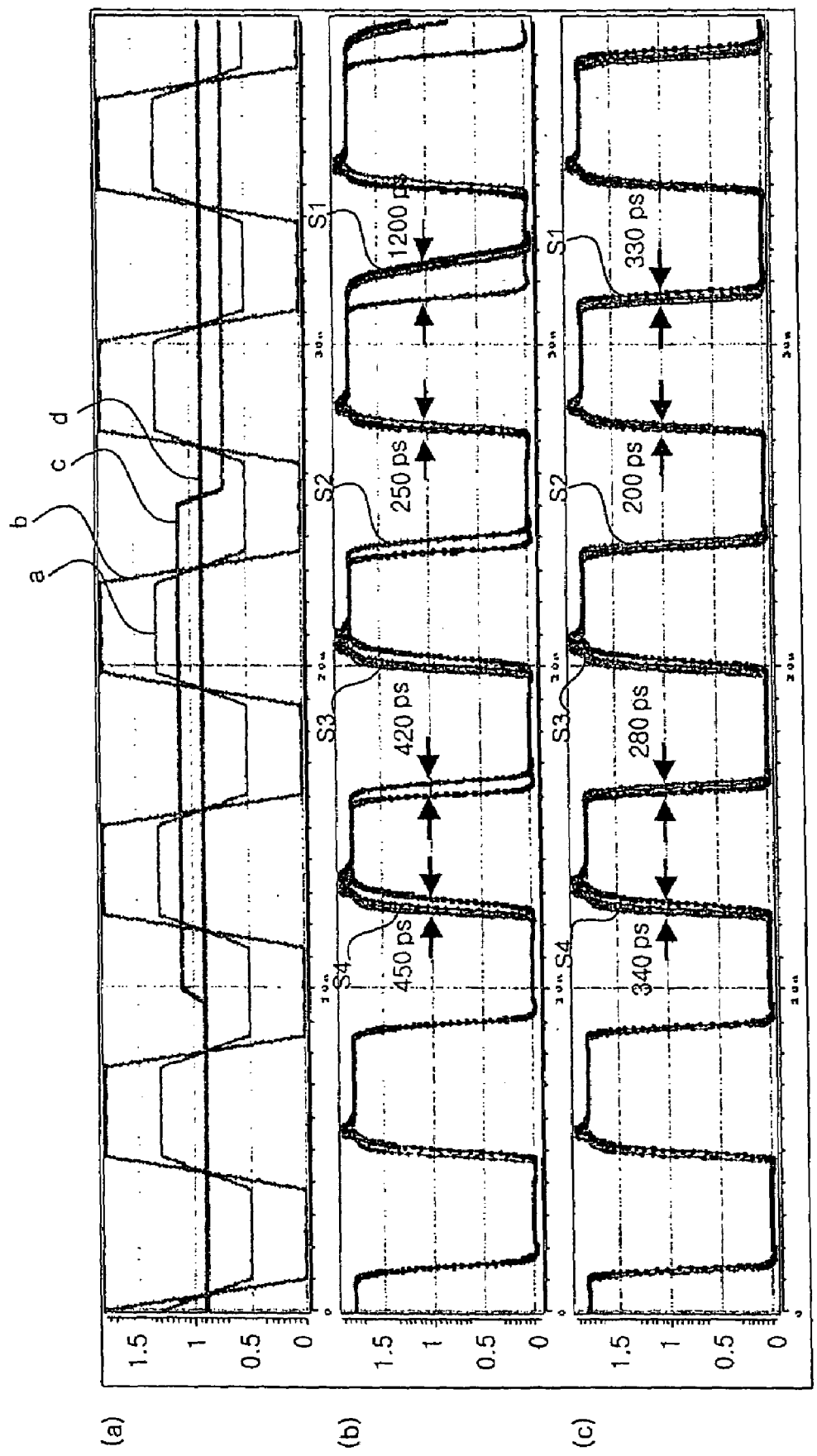
FIG. 5 shows simulation results obtained by inputting an input signal and a reference voltage signal according to four scenarios.

In FIGS. 5A to 5C, the x-axis represents time in nanoseconds, and the y-axis represents voltage level in volts. Signals S1 to S4 in FIGS. 5B and 5C represent the four scenarios described above.

Referring to FIG. 5B, in the comparative example without the third input element, when the reference voltage signal is bumped to about 0.7V and a low level input signal is input, the delay difference between S1 and S2 is a very long 1200 ps. In contrast, referring to FIG. 5C, even though the reference voltage signal is bumped to about 0.7 and a low level input signal is input, the delay difference between S1 and S2 is a relatively short 330 ps.

Although the invention has been described in connection with the exemplary embodiments of the invention, it will be apparent to those skilled in the art that various modifications and changes may be made thereto without departing from the scope and spirit of the invention. Therefore, it should be understood that the above embodiments are not limitative, but illustrative in all aspects.

The differential amplifier as described above has one or more effects as follows. In the differential amplifier, even when the reference voltage signal is bumped to be low and a low level input signal is input, it is possible to shorten the delay when an output signal corresponding to the input signal is output. Therefore, the output signal's duty can be constantly maintained and skew can be reduced. As a result, it is possible to improve the operating characteristic of the differential amplifier.

What is claimed is:

1. A differential amplifier, comprising:
   a first load element coupled between a first voltage and a first node;
   a second load element coupled between the first voltage and a second node;
   a current source coupled between a second voltage and a third node;
   a first input element, coupled between the first node and the third node, that receives an input signal so as to adjust a voltage level of the first node;
   a second input element, coupled between the second node and the third node, that receives a reference voltage signal so as to adjust a voltage level of the second node; and
   a third input element, coupled between the second node and the third node, the third input element comprising an inverter, which receives and inverts the input signal, and a transistor, which receives the inverted input signal so as to adjust the voltage level of the second node,
   wherein the third input element turns on when a voltage level of the input signal is lower than a voltage level of the reference voltage signal.

2. The differential amplifier of claim 1, wherein the first input element comprises a first NMOS transistor having a gate to which the input signal is input.

3. The differential amplifier of claim 2, wherein the second input element comprises a second NMOS transistor having a gate to which the reference voltage signal is input.

4. The differential amplifier of claim 3, wherein the first and second NMOS transistors are substantially the same size.

5. The differential amplifier of claim 3, wherein the transistor of the third input element comprises a third NMOS transistor that is coupled between the second node and the third node and includes a gate to which the inverted input signal is input.

6. The differential amplifier of claim 5, wherein a size of the third NMOS transistor is 10% to 100% of the second NMOS transistor.

7. The differential amplifier of claim 1, wherein the first and second load elements comprise first and second PMOS transistors having respective gates coupled to the second node, respectively.

8. The differential amplifier of claim 7, wherein the first and second PMOS transistors are substantially the same size.

9. The differential amplifier of claim 1, wherein the current source comprises a resistor.

10. The differential amplifier of claim 1, wherein when the voltage level of the input signal is greater than the voltage level of the reference voltage signal, a first current flowing through the first input element is greater than a second current flowing through the second input element, and the transistor of the third input element is in an off state, and
    wherein when the voltage level of the input signal is lower than the voltage level of the reference voltage signal, the first current flowing through the first input element is less than the second current flowing through the second input element.

11. The differential amplifier of claim 10, wherein when the first current flowing through the first input element is greater than the second current flowing through the second input element and the transistor of the third input element is in the off state, the voltage level of the first node is reduced more quickly than the voltage level of the second node, resulting in a low level at the first node, and
    wherein when the first current flowing through the first input element is less than the second current flowing through the second input element and the transistor of the third input element is in the on state, the voltage level of the second node is reduced more quickly than the voltage level of the first node, resulting in a high level at the first node.

12. A differential amplifier, comprising:
    a first load element coupled between a first voltage and a first node;
    a second load element coupled between the first voltage and a second node;
    a current source coupled between a second voltage and a third node;
    a first NMOS transistor coupled between the first node and the third node, a first current flowing through the first NMOS transistor in response to an input signal so as to adjust a voltage level of the first node;
    a second NMOS transistor coupled between the second node and the third node, a second current flowing through the second NMOS transistor in response to a reference voltage signal so as to adjust a voltage level of the second node; and
    a third NMOS transistor coupled between the second node and the third node, the third NMOS transistor turning on or off in response to an inverted signal of the input signal so as to adjust the voltage level of the second node;
    wherein the third NMOS transistor turns on when a voltage level of the input signal is lower than a voltage level of the reference voltage signal, and
    wherein the input signal comprises a TTL logic level signal and the inverted signal comprises a CMOS logic level signal.

13. The differential amplifier of claim 12, wherein the first and second NMOS transistors are substantially the same size.

14. The differential amplifier of claim 12, wherein the size of the third NMOS transistor is 10% to 100% of that of the second NMOS transistor.

15. The differential amplifier of claim 12, further comprising:
    an inverter coupled between a gate of the first NMOS transistor and a gate of the third NMOS transistor, the inverter providing the inverted signal of the input signal.

16. The differential amplifier of claim 12, wherein the first and second load elements comprise first and second PMOS transistors, respectively, each of the first and second PMOS transistors comprising a gate coupled to the second node.

17. The differential amplifier of claim 16, wherein the first and second PMOS transistors are substantially the same size.

18. The differential amplifier of claim 12, wherein the current source comprises a resistor.

19. A differential amplifier, comprising:
    a first load coupled between a first voltage and a first node;
    a second load coupled between the first voltage and a second node;
    a current source coupled between a second voltage and a third node;
    a first NMOS transistor, coupled between the first node and the third node, configured to receive an input signal at a corresponding first gate and to adjust a voltage level of the first node;
    a second NMOS transistor, coupled between the second node and the third node, configured to receive a reference voltage signal at a corresponding second gate and to adjust a voltage level of the second node; and
    a third NMOS transistor, coupled between the second node and the third node, configured to receive an inverted input signal at a corresponding third gate and to adjust the voltage level of the second node, the third NMOS transistor turning on when a voltage level of the input signal is lower than a voltage level of the reference voltage signal, wherein the input signal comprises a TTL logic level signal and the inverted input signal comprises a CMOS logic level signal, which is input to the third gate.

20. The differential amplifier of claim 19, wherein the first and second loads comprise first and second PMOS transistors having respective gates coupled to the second node, respectively.

* * * * *

UNITED STATES PATENT AND TRADEMARK OFFICE
CERTIFICATE OF CORRECTION

| | |
|---|---|
| PATENT NO. | : 7,564,272 B2 |
| APPLICATION NO. | : 11/526693 |
| DATED | : July 21, 2009 |
| INVENTOR(S) | : In-soo Park |

It is certified that error appears in the above-identified patent and that said Letters Patent is hereby corrected as shown below:

Title Page;

The correct Assignee (73) should be listed as:

Samsung Electronics Co., Ltd., Suwon-si, Gyeonggi-do, Republic of Korea

Signed and Sealed this
Eighteenth Day of January, 2011

David J. Kappos
*Director of the United States Patent and Trademark Office*